US012658914B2

(12) United States Patent
Shi et al.

(10) Patent No.: US 12,658,914 B2
(45) Date of Patent: Jun. 16, 2026

(54) LEAKAGE COMPENSATION CIRCUIT, CHIP, AND ELECTRONIC DEVICE

(71) Applicant: SHANGHAI SG MICRO CO., LTD., Shanghai (CN)

(72) Inventors: Chenyue Shi, Shanghai (CN); Huan Wang, Shanghai (CN); Xiang Yu, Shanghai (CN)

(73) Assignee: SHANGHAI SG MICRO CO., LTD., Shanghai (CN)

( * ) Notice: Subject to any disclaimer, the term of this patent is extended or adjusted under 35 U.S.C. 154(b) by 44 days.

(21) Appl. No.: 18/879,825

(22) PCT Filed: Jul. 17, 2023

(86) PCT No.: PCT/CN2023/107787
    § 371 (c)(1),
    (2) Date: Dec. 30, 2024

(87) PCT Pub. No.: WO2024/139178
    PCT Pub. Date: Jul. 4, 2024

(65) Prior Publication Data
    US 2025/0379573 A1     Dec. 11, 2025

(30) Foreign Application Priority Data

Dec. 28, 2022    (CN) .......................... 202211702432.8

(51) Int. Cl.
    *H03K 17/16*        (2006.01)
    *H03F 3/45*         (2006.01)
(52) U.S. Cl.
    CPC ....... *H03K 17/161* (2013.01); *H03F 3/45475* (2013.01)

(58) Field of Classification Search
    CPC ...... H03K 17/14; H03K 17/145; H03K 17/16; H03K 17/161; H03K 17/162;
    (Continued)

(56) References Cited

U.S. PATENT DOCUMENTS 6,744,303 B1     6/2004  Maley
2018/0217624 A1*  8/2018  Shiine ..................... G05F 1/625

FOREIGN PATENT DOCUMENTS

CN      108376013 A      8/2018
CN      113093852 A      7/2021
        (Continued)

*Primary Examiner* — Long Nguyen
(74) *Attorney, Agent, or Firm* — Bayramoglu Law Offices LLC

(57) ABSTRACT

A leakage compensation circuit, a chip, and an electronic device are provided. The leakage compensation circuit includes an output stage circuit, a first sampling circuit, an operational amplifier circuit, and a second sampling circuit. The operational amplifier circuit includes an operational amplifier output stage circuit and an operational amplifier first stage circuit. The first sampling circuit samples a leakage current of the output stage circuit to obtain a first sampling current, and provides it to the operational amplifier output stage circuit via a first node. The second sampling circuit samples a current of the operational amplifier output stage circuit to obtain a second sampling current, and provides it to the output stage circuit via a second node, to compensate for the leakage current of the output stage circuit. The operational amplifier first stage circuit clamps voltages at the first node and the second node.

20 Claims, 5 Drawing Sheets

(58) Field of Classification Search
CPC .. H03K 17/165; H03K 17/687; H03K 19/003;
H03K 19/00369; H03F 3/45475
See application file for complete search history.

(56) References Cited

FOREIGN PATENT DOCUMENTS

| | | | |
|----|-------------|---|--------|
| CN | 114244336 A | | 3/2022 |
| CN | 116015262 A | | 4/2023 |

* cited by examiner

LEAKAGE COMPENSATION CIRCUIT, CHIP, AND ELECTRONIC DEVICE

CROSS REFERENCE TO THE RELATED APPLICATIONS

This application is the national phase entry of International Application No. PCT/CN2023/107787, filed on Jul. 17, 2023, which is based upon and claims priority to Chinese Patent Application No. 202211702432.8, filed on Dec. 28, 2022, the entire contents of which are incorporated herein by reference.

TECHNICAL FIELD

The embodiments of the present disclosure relate to a field of integrated circuit technology, in particular to a leakage compensation circuit, a chip, and an electronic device.

BACKGROUND

Due to a presence of a PN junction between a source electrode and a substrate of a MOS transistor and a PN junction between a drain electrode and the substrate of the MOS transistor, there is a leakage current in the MOS transistor even when the MOS transistor is in a turn-off state. Especially for high drive and high voltage output stages, due to a large size of the MOS transistor, the leakage current is also high. The leakage current flows out from the output terminal, and will generate excessive leakage current.

At present, the handling method of the leakage current is generally optimizing in a process perspective, but the problem of leakage current has not been fundamentally solved.

SUMMARY

The purpose of the embodiments of the present application is to provide a leakage compensation circuit, a chip, and an electronic device, which samples a leakage current of an output stage and returns the sampled current to the output stage, thereby compensating for the leakage current in the output stage.

In order to achieve the above purpose, a first aspect of the present disclosure provides a leakage compensation circuit. The leakage compensation circuit includes: an output stage circuit, a first sampling circuit, an operational amplifier circuit, and a second sampling circuit. Wherein the operational amplifier circuit includes an operational amplifier output stage circuit and an operational amplifier first stage circuit which are coupled together. The first sampling circuit is configured to sample a leakage current of the output stage circuit to obtain a first sampling current, and provide the first sampling current to the operational amplifier output stage circuit via a first node. The second sampling circuit is configured to sample a current of the operational amplifier output stage circuit to obtain a second sampling current, and provide the second sampling current to the output stage circuit via a second node to compensate for a leakage current of the output stage circuit. The operational amplifier first stage circuit is configured to clamp voltages at the first node and the second node.

In some embodiments of the present disclosure, a non-inverting input terminal of the operational amplifier first stage circuit is coupled to the second node, and an inverting input terminal of the operational amplifier first stage circuit is coupled to the first node.

In some embodiments of the present disclosure, the operational amplifier output stage circuit includes a fifth transistor and a sixth transistor. A control electrode of the fifth transistor is coupled to a first output terminal of the operational amplifier first stage circuit. A first electrode of the fifth transistor is coupled to a fifth voltage terminal. A second electrode of the fifth transistor is coupled to the first node. A control electrode of the sixth transistor is coupled to a second output terminal of the operational amplifier first stage circuit. A first electrode of the sixth transistor is coupled to a second voltage terminal A second electrode of the sixth transistor is coupled to the first node.

In some embodiments of the present disclosure, the second sampling circuit includes a seventh transistor and an eighth transistor. A control electrode of the seventh transistor is coupled to a first output terminal of the operational amplifier first stage circuit. A first electrode of the seventh transistor is coupled to the fifth voltage terminal. A second electrode of the seventh transistor is coupled to the second node. A width-length ratio of the seventh transistor is a fixed multiple of the width-length ratio of the fifth transistor. A control electrode of the eighth transistor is coupled to the second output terminal of the operational amplifier first stage circuit. A first electrode of the eighth transistor is coupled to the second voltage terminal. A second electrode of the eighth transistor is coupled to the second node. The width-length ratio of the eighth transistor is a fixed multiple of the width-length ratio of the sixth transistor.

In some embodiments of the present disclosure, the operational amplifier output stage circuit further includes: a ninth transistor, a tenth transistor, an eleventh transistor, and a twelfth transistor. A control electrode of the ninth transistor is coupled to a sixth voltage terminal. A first electrode of the ninth transistor is coupled to the second electrode of the seventh transistor. A second electrode of the ninth transistor is coupled to the second node. A control electrode of the tenth transistor is coupled to the sixth voltage terminal. A first electrode of the tenth transistor is coupled to the second electrode of the fifth transistor. A second electrode of the tenth transistor is coupled to the first node. A control electrode of the eleventh transistor is coupled to a seventh voltage terminal. A first electrode of the eleventh transistor is coupled to the second electrode of the eighth transistor. A second electrode of the eleventh transistor is coupled to the second node. A control electrode of the twelfth transistor is coupled to the seventh voltage terminal. A first electrode of the twelfth transistor is coupled to the second electrode of the sixth transistor. A second electrode of the twelfth transistor is coupled to the first node.

In some embodiments of the present disclosure, the output stage circuit includes a first transistor and a second transistor. A control electrode of the first transistor is coupled to a third voltage terminal. A first electrode of the first transistor is coupled to a first voltage terminal. A second electrode of the first transistor is coupled to the second node. A control electrode of the second transistor is coupled to a fourth voltage terminal. A first electrode of the second transistor is coupled to a second voltage terminal. A second electrode of the second transistor is coupled to the second node. The first sampling circuit includes a third transistor and a fourth transistor. A control electrode of the third transistor is coupled to the third voltage terminal. A first electrode of the third transistor is coupled to the first voltage terminal. A second electrode of the third transistor is coupled to the first node. A control electrode of the fourth transistor is coupled to a fourth voltage terminal. A first electrode of the fourth transistor is coupled to the second voltage terminal. A second electrode of the fourth transistor is coupled to the first node. A width-length ratio of the first transistor is a fixed multiple of the width-length ratio of the third transistor, and the width-length ratio of the second transistor is a fixed multiple of the width-length ratio of the fourth transistor.

In some embodiments of the present disclosure, the output stage circuit includes a first transistor and a first resistor. A control electrode of the first transistor is coupled to a third voltage terminal. A first electrode of the first transistor is coupled to a first voltage terminal. A second electrode of the first transistor is coupled to the second node. A first end of the first resistor is coupled to the second node. A second end of the first resistor is coupled to the second voltage terminal. The first sampling circuit includes a third transistor and a second resistor. A control electrode of the third transistor is coupled to the third voltage terminal. A first electrode of the third transistor is coupled to the first voltage terminal. A second electrode of the third transistor is coupled to the first node. A first end of the second resistor is coupled to the first node. A second end of the second resistor is coupled to the second voltage terminal. A width-length ratio of the first transistor is a fixed multiple of the width-length ratio of the third transistor. The resistance value of the second resistor is a fixed multiple of the resistance value of the first resistor.

In some embodiments of the present disclosure, the output stage circuit includes a second transistor and a third resistor. A control electrode of the second transistor is coupled to a fourth voltage terminal. A first electrode of the second transistor is coupled to a second voltage terminal. A second electrode of the second transistor is coupled to the second node. A first end of the third resistor is coupled to the second node. A second end of the third resistor is coupled to a first voltage terminal. The first sampling circuit includes a fourth transistor and a fourth resistor. A control electrode of the fourth transistor is coupled to the fourth voltage terminal. A first electrode of the fourth transistor is coupled to the second voltage terminal. A second electrode of the fourth transistor is coupled to the first node. A first end of the fourth resistor is coupled to the first node. The second end of the fourth resistor is coupled to the first voltage terminal. A width-length ratio of the second transistor is a fixed multiple of the width-length ratio of the fourth transistor. A resistance value of the fourth resistor is a fixed multiple of the resistance value of the third resistor.

A second aspect of the present disclosure provides a chip. The chip includes the leakage compensation circuit according to the first aspect of the present disclosure.

A third aspect of the present disclosure provides an electronic device. The electronic device includes the chip according to the second aspect of the present disclosure.

The other features and advantages of the embodiments of the present disclosure will be explained in detail in the subsequent section of detailed description of the embodiments.

BRIEF DESCRIPTION OF THE DRAWINGS

The accompanying drawings are intended to provide a further understanding of the embodiments of the present disclosure and form a part of the specification. They are used together with the specific embodiments below to explain the embodiments of the present disclosure, but do not limit the present disclosure, in which.

Figure 1:
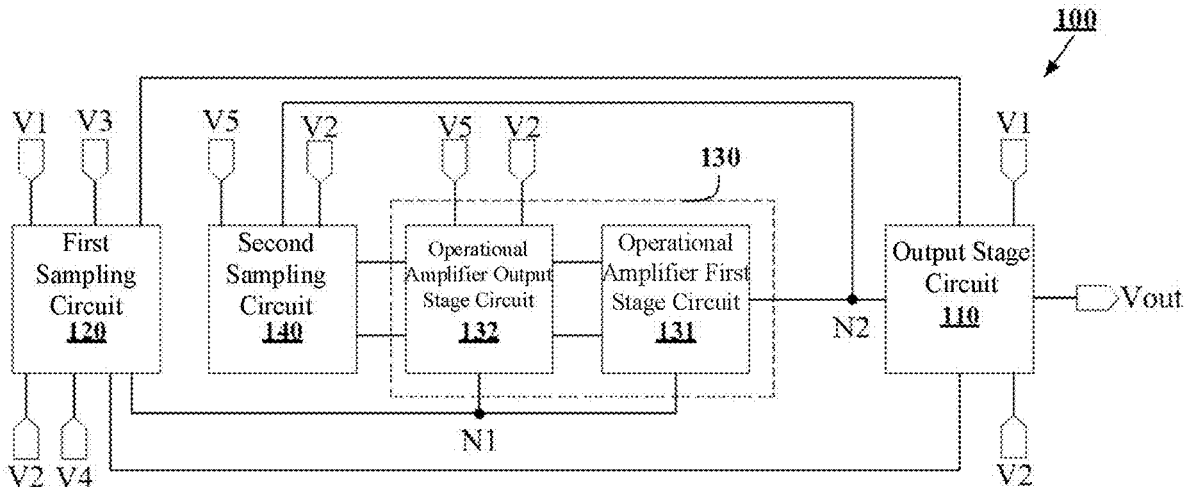
FIG. 1 is a schematic block diagram of a leakage compensation circuit according to an embodiment of the present disclosure.

It should be noted that the elements in the drawings are schematic and not drawn to scale.

DETAILED DESCRIPTION OF THE EMBODIMENTS

To make the technical solutions and advantages of the embodiments of the present disclosure clearer, the technical solutions in the embodiments of the present disclosure will be described clearly and completely below, in conjunction with the accompanying drawings in the embodiments of the present disclosure. Obviously, the described embodiments are merely some but not all of the embodiments of the present disclosure. All other embodiments obtained by those skilled in the art based on the described embodiments of the present disclosure without creative efforts shall fall within the protecting scope of the present disclosure.

Unless otherwise defined, all terms (including technical and scientific terms) used herein have the same meaning as commonly understood by those skilled in the art to which present disclosure belongs. It will be further understood that terms, such as those defined in commonly used dictionaries, should be interpreted as having a meaning that is consistent with their meaning in the context of the specification and will not be interpreted in an idealized or overly formal sense unless expressly so defined herein. As used herein, the description of "connecting" or "coupling" two or more parts together should refer to the parts being directly combined together or being combined via one or more intermediate components.

In all the embodiments of the present disclosure, a source and a drain of a Metal-Oxide-Semiconductor Field-Effect Transistor (MOS transistor) are symmetrical, and a current from the source to the drain to turn on an N-type transistor is in an opposite direction with respect to the current from the source to the drain to turn on a P-type transistor. Therefore, in the embodiments of the present disclosure, a controlled intermediate terminal of the transistor is referred to as a control electrode, and the remaining two terminals are referred to as a first electrode and a second electrode. In addition, terms such as "first" and "second" are only used to distinguish one element (or a part of the element) from another element (or another part of this element).

FIG. 1 shows a schematic block diagram of a leakage compensation circuit 100. The leakage compensation circuit 100 may include: an output stage circuit 110, a first sampling circuit 120, an operational amplifier circuit 130, and a second sampling circuit 140. The operational amplifier circuit 130 includes an operational amplifier output stage circuit 132 and an operational amplifier first stage circuit 131. The operational amplifier output stage circuit 132 and the operational amplifier first stage circuit 131 are coupled to each other.

The output stage circuit 110 can be coupled to the first sampling circuit 120, the operational amplifier first stage circuit 131, the second sampling circuit 140, a first voltage terminal V1, a second voltage terminal V2, and an output terminal Vout. The first sampling circuit 120 may be coupled to the output stage circuit 110, the operational amplifier output stage circuit 132, the operational amplifier first stage circuit 131, the first voltage terminal V1, the second voltage terminal V2, a third voltage terminal V3, and a fourth voltage terminal V4. The operational amplifier first stage circuit 131 may be coupled to the operational amplifier output stage circuit 132, the first sampling circuit 120, the output stage circuit 110, and the second sampling circuit 140. The operational amplifier output stage circuit 132 may be coupled to the operational amplifier first stage circuit 131, the first sampling circuit 120, the second sampling circuit 140, the fifth voltage terminal V5, and the second voltage terminal V2. The second sampling circuit 140 may be coupled to the operational amplifier output stage circuit 132, the operational amplifier first stage circuit 131, the output stage circuit 110, the fifth voltage terminal V5, and the second voltage terminal V2.

The first sampling circuit 120 is configured to sample a leakage current of the output stage circuit 110 to obtain a first sampling current, and provide the first sampling current to the operational amplifier output stage circuit 132 via a first node N1. The second sampling circuit 140 is configured to sample a current of the operational amplifier output stage circuit 132 to obtain a second sampling current, and provide the second sampling current to the output stage circuit 110 via a second node N2 to compensate for the leakage current of the output stage circuit 110. The operational amplifier first stage circuit 131 is configured to clamp voltages at the first node N1 and the second node N2.

The output stage circuit 110 in the embodiments of the present application is a high-impedance-state output stage circuit. The conventional output stage circuit may include a single PMOS transistor (i.e. the output stage circuit is a PMOS output stage), or a single NMOS transistor (i.e. the output stage circuit is a NMOS output stage), or a stack structure of one PMOS transistor and one NMOS transistor from up to down (i.e., the output stage circuit is a CMOS output stage).

In the following, taking the output stage circuit 110 being the CMOS output stage, the PMOS output stage, and the NMOS output stage for example.

Figure 2:
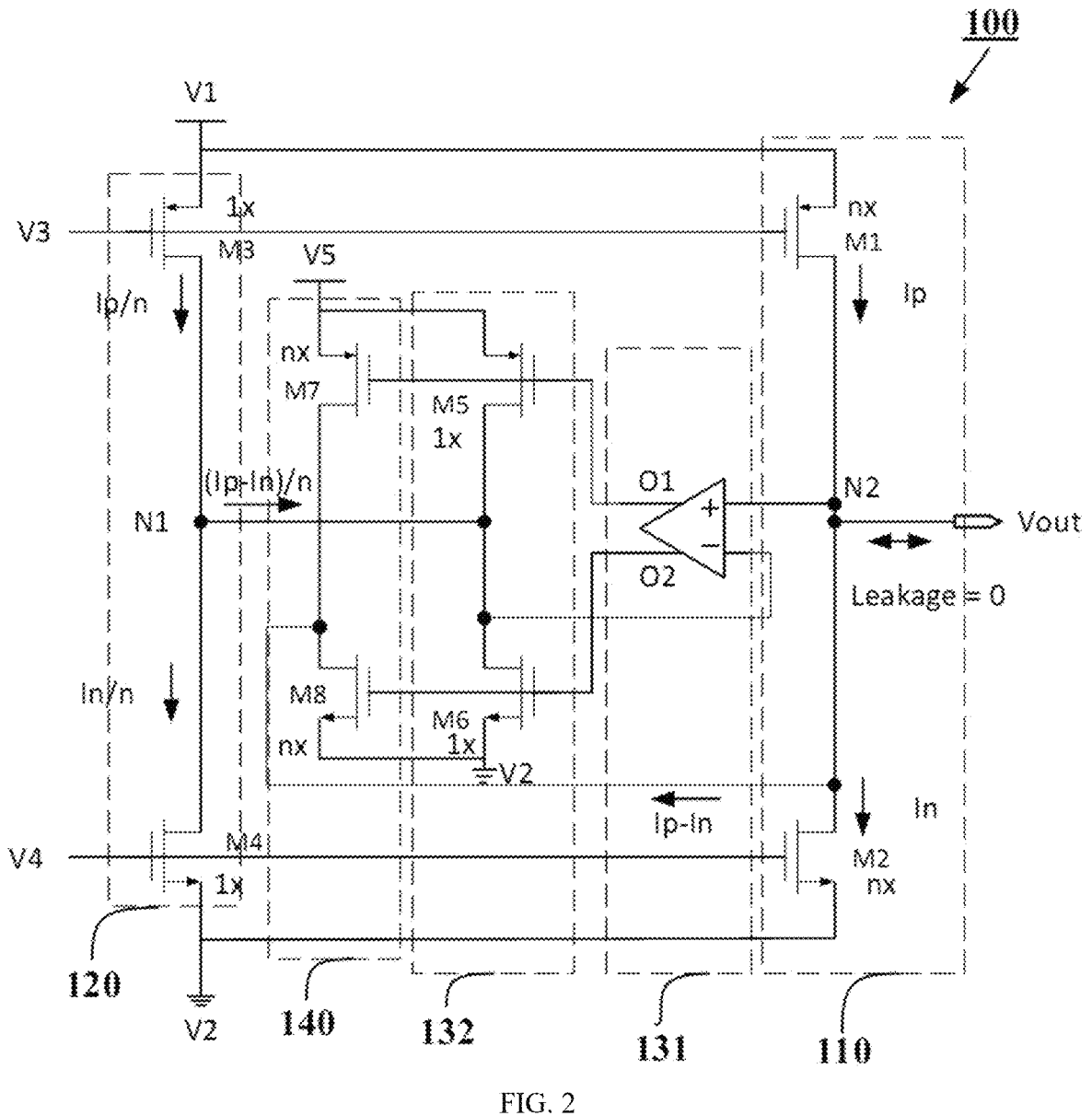
FIG. 2 is an exemplary circuit diagram of a leakage compensation circuit according to an embodiment of the present disclosure.

FIG. 2 shows an exemplary circuit diagram where the output stage circuit 110 of the leakage compensation circuit 100 shown in FIG. 1 is a CMOS output stage. As shown in FIG. 2, the output stage circuit 110 may include a first transistor M1 and a second transistor M2. A control electrode of the first transistor M1 is coupled to the third voltage terminal V3. A first electrode of the first transistor M1 is coupled to the first voltage terminal V1. A second electrode of the first transistor M1 is coupled to the second node N2. A control electrode of the second transistor M2 is coupled to the fourth voltage terminal V4. A first electrode of the second transistor M2 is coupled to the second voltage terminal V2. A second electrode of the second transistor M2 is coupled to the second node N2. Correspondingly, the first sampling circuit 120 may include a third transistor M3 and a fourth transistor M4. A control electrode of the third transistor M3 is coupled to the third voltage terminal V3. A first electrode of the third transistor M3 is coupled to the first voltage terminal V1. A second electrode of the third transistor M3 is coupled to the first node N1. A control electrode of the fourth transistor M4 is coupled to the fourth voltage terminal V4. A first electrode of the fourth transistor M4 is coupled to the second voltage terminal V2. A second electrode of the fourth transistor M4 is coupled to the first node N1. A width-length ratio of the first transistor M1 is a fixed multiple n of the width-length ratio of the third transistor M3. The width-length ratio of the second transistor M2 is a fixed multiple n of the width-length ratio of the fourth transistor M4. Meanwhile, a non-inverting input terminal of the operational amplifier first stage circuit 131 is coupled to the second node N2, and a inverting input terminal of the operational amplifier first stage circuit 131 is coupled to the first node N1. The operational amplifier output stage circuit 132 may include a fifth transistor M5 and a sixth transistor M6. A control electrode of the fifth transistor M5 is coupled to a first output terminal O1 of the operational amplifier first stage circuit 131. A first electrode of the fifth transistor M5 is coupled to the fifth voltage terminal V5. A second electrode of the fifth transistor M5 is coupled to the first node N1. A control electrode of the sixth transistor M6 is coupled to a second output terminal O2 of the operational amplifier first stage circuit 131. A first electrode of the sixth transistor M6 is coupled to the second voltage terminal V2. A second electrode of the sixth transistor M6 is coupled to the first node N1. The second sampling circuit 140 may include a seventh transistor M7 and an eighth transistor M8. A control electrode of the seventh transistor M7 is coupled to the first output terminal O1 of the operational amplifier first stage circuit 131. A first electrode of the seventh transistor M7 is coupled to the fifth voltage terminal V5. A second electrode of the seventh transistor M7 is coupled to the second node N2. The width-length ratio of the seventh transistor M7 is a fixed multiple n of the width-length ratio of the fifth transistor M5. A control electrode of the eighth transistor M8 is coupled to the second output terminal O2 of the operational amplifier first stage circuit 131. A first electrode of the eighth transistor M8 is coupled to the second voltage terminal V2. A second electrode of the eighth transistor M8 is coupled to the second node N2. The width-length ratio of the eighth transistor M8 is a fixed multiple n of the width-length ratio of the sixth transistor M6.

Figure 3:
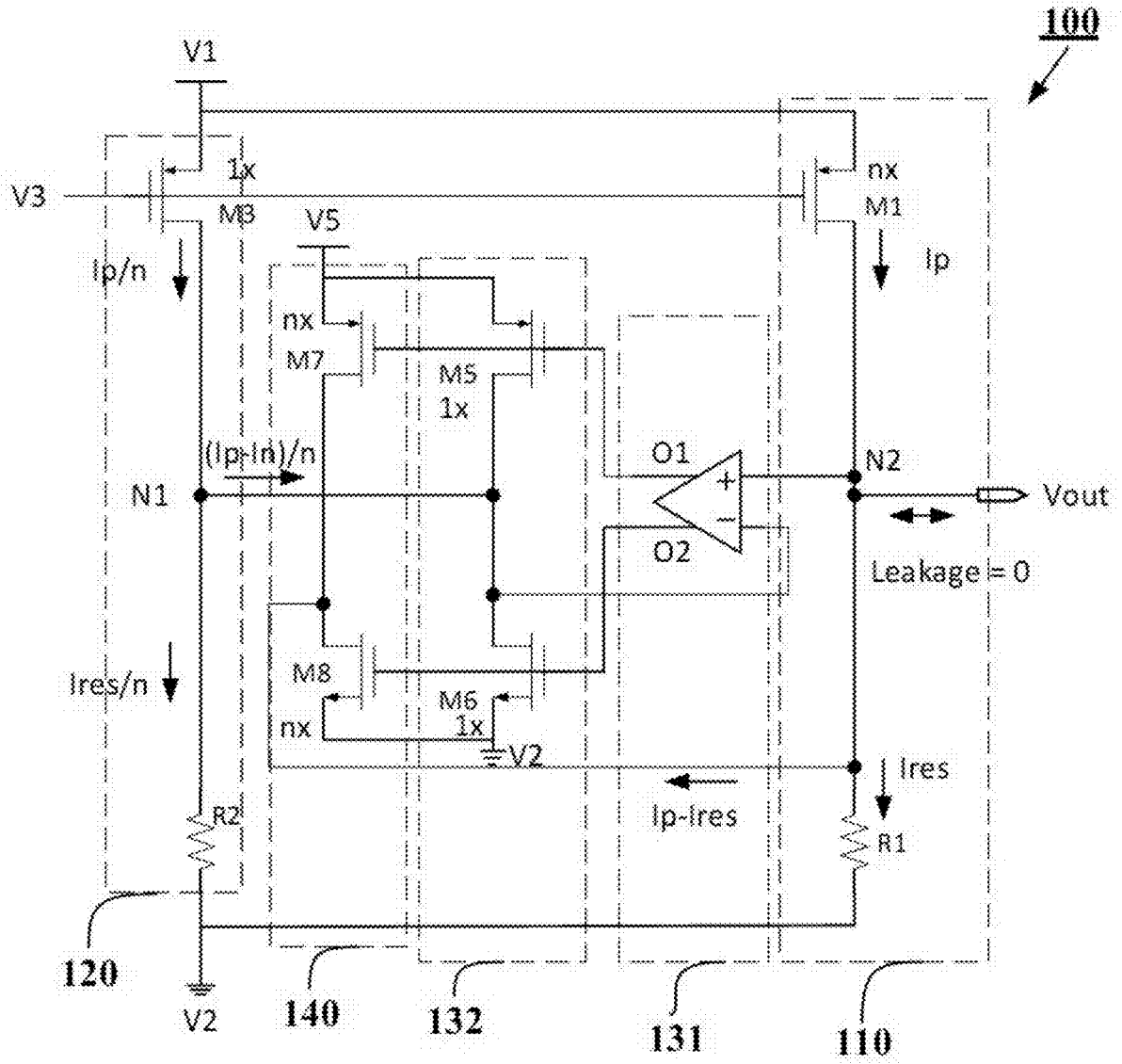
FIG. 3 is another exemplary circuit diagram of a leakage compensation circuit according to an embodiment of the present disclosure.

FIG. 3 shows an exemplary circuit diagram where the output stage circuit 110 of the leakage compensation circuit 100 shown in FIG. 1 is a PMOS output stage. As shown in FIG. 3, the output stage circuit 110 may include a first transistor M1 and a first resistor R1. The control electrode of the first transistor M1 is coupled to the third voltage terminal V3. The first electrode of the first transistor M1 is coupled to the first voltage terminal V1. The second electrode of the first transistor M1 is coupled to the second node N2. The first end of the first resistor R1 is coupled to the second node N2. The second end of the first resistor R1 is coupled to the second voltage terminal V2. Correspondingly, the first sampling circuit 120 may include a third transistor M3 and a second resistor R2. The control electrode of the third transistor M3 is coupled to the third voltage terminal V3. The first electrode of the third transistor M3 is coupled to the first voltage terminal V1. The second electrode of the third transistor M3 is coupled to the first node N1. The first end of the second resistor R2 is coupled to the first node N1. The second end of the second resistor R2 is coupled to the second voltage terminal V2. The width-length ratio of the first transistor M1 is a fixed multiple n of the width-length ratio of the third transistor M3. A resistance value of the second resistor R2 is a fixed multiple n of the resistance value of the first resistor R1. In addition, as shown in FIG. 3, the connections of the operational amplifier first stage circuit 131, the operational amplifier output stage circuit 132, and the second sampling circuit 140 are the same as those in the circuit diagram shown in FIG. 2, and thus will not be repeated here.

Figure 4:
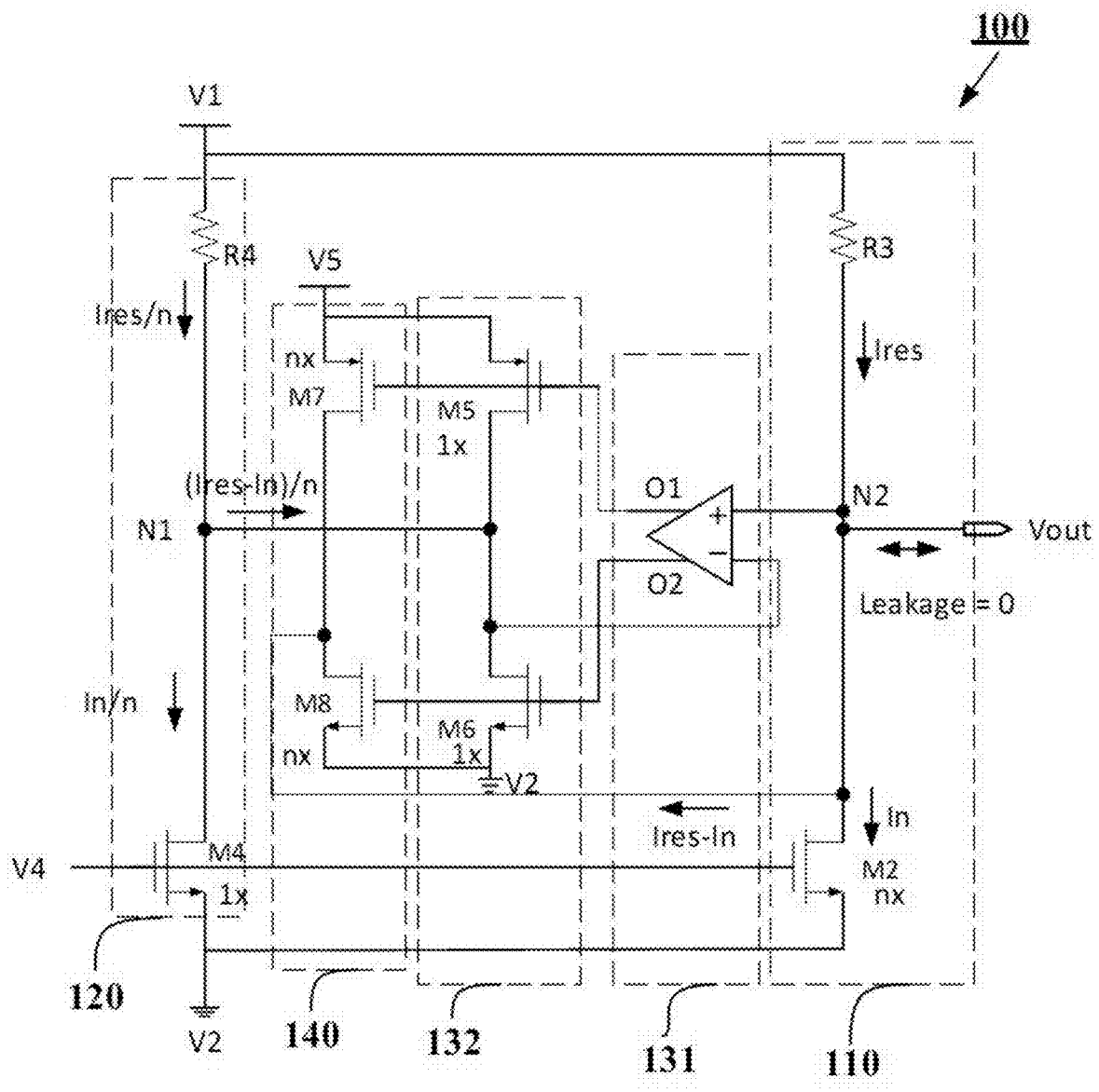
FIG. 4 is yet another exemplary circuit diagram of a leakage compensation circuit according to an embodiment of the present disclosure.

FIG. 4 shows an exemplary circuit diagram where the output stage circuit 110 of the leakage compensation circuit 100 shown in FIG. 1 is an NMOS output stage. As shown in FIG. 4, the output stage circuit 110 may include a second transistor M2 and a third resistor R3. The control electrode of the second transistor M2 is coupled to the fourth voltage terminal V4. The first electrode of the second transistor M2 is coupled to the second voltage terminal V2. The second electrode of the second transistor M2 is coupled to the second node N2. The first end of the third resistor R3 is coupled to the second node N2. The second end of the third resistor R3 is coupled to the first voltage terminal V1. Correspondingly, the first sampling circuit 120 may include a fourth transistor M4 and a fourth resistor R4. The control electrode of the fourth transistor M4 is coupled to the fourth voltage terminal V4. The first electrode of the fourth transistor M4 is coupled to the second voltage terminal V2. The second electrode of the fourth transistor M4 is coupled to the first node N1. The first end of the fourth resistor R4 is coupled to the first node N1. The second end of the fourth resistor R4 is coupled to the first voltage terminal V1. The width-length ratio of the second transistor M2 is a fixed multiple n of the width-length ratio of the fourth transistor M4. The resistance value of the fourth resistor R4 is a fixed multiple n of the resistance value of the third resistor R3. In addition, as shown in FIG. 4, the connections of the operational amplifier first stage circuit 131, the operational amplifier output stage circuit 132, and the second sampling circuit 140 are the same as those in the circuit diagram shown in FIG. 2, and thus will not be repeated here.

Figure 5:
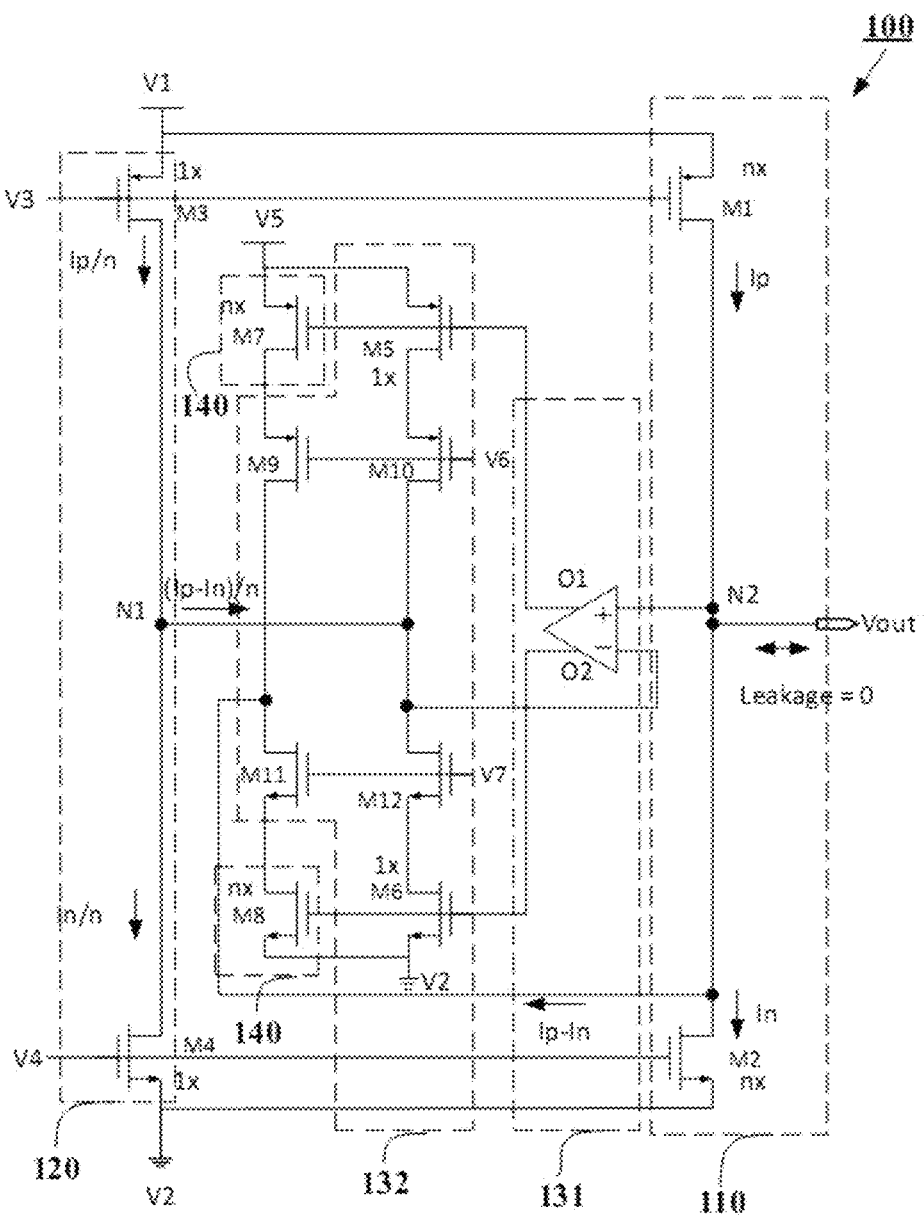
FIG. 5 is an exemplary circuit diagram of an operational amplifier output stage circuit of a leakage compensation circuit according to the embodiment of the present disclosure.

In addition, due to a voltage deviation value between the non-inverting input terminal and the inverting input terminal of the operational amplifier first stage circuit 131, in order to isolate this voltage deviation value, taking the output stage circuit 110 of the leakage compensation circuit 100 shown in FIG. 2 being the CMOS output stage as an example, as shown in FIG. 5, the operational amplifier output stage circuit 132 may further include: a ninth transistor M9, a tenth transistor M10, an eleventh transistor M11, and a twelfth transistor M12. A control electrode of the ninth transistor M9 is coupled to the sixth voltage terminal V6. A first electrode of the ninth transistor M9 is coupled to the second electrode of the seventh transistor M7. A second electrode of the ninth transistor M9 is coupled to the second node N2. A control electrode of the tenth transistor M10 is coupled to the sixth voltage terminal V6. A first electrode of the tenth transistor M10 is coupled to the second electrode of the fifth transistor M5. A second electrode of the tenth transistor M10 is coupled to the first node N1. A control electrode of the eleventh transistor M11 is coupled to the seventh voltage terminal V7. A first electrode of the eleventh transistor M11 is coupled to the second electrode of the eighth transistor M8. A second electrode of the eleventh transistor M11 is coupled to the second node N2. A control electrode of the twelfth transistor M12 is coupled to the seventh voltage terminal V7. A first electrode of the twelfth transistor M12 is coupled to the second electrode of the sixth transistor M6. A second electrode of the twelfth transistor M12 is coupled to the first node N1.

In the examples shown in FIGS. 1 to 5, a high voltage signal VDD is input from the first voltage terminal V1, the second voltage terminal V2 is grounded, and a voltage inputted from the third voltage terminal V3 makes a gate-source voltage of the third transistor M3 be less than the threshold voltage, a voltage inputted from the fourth voltage terminal V4 is less than the threshold voltage of the fourth transistor M4, a high voltage signal is inputted from the fifth voltage terminal V5, and inputs of the sixth voltage terminal V6 and the seventh voltage terminal V7 are bias voltages, which make sure that the ninth transistor M9 to the twelfth transistor M12, as well as the fifth transistor M5 to the eighth transistor M8, are in a normal working state. In other words, not only are the gate-source voltages of the ninth transistor M9 to the twelfth transistor M12 greater than the threshold voltage, but also the fifth transistor M5 to the eighth transistor M8 are in a saturation region. The first transistor M1, the third transistor M3, the fifth transistor M5, the seventh transistor M7, the ninth transistor M9, and the tenth transistor M10 are all PMOS transistors. The second transistor M2, the fourth transistor M4, the sixth transistor M6, the eighth transistor M8, the eleventh transistor M11, and the twelfth transistor M12 are all NMOS transistors. Those skills in the art should understand that the modifications made to the circuits shown in FIGS. 2 to 5 based on the above invention concept should also fall within the protection scope of the present disclosure. In those variants, the above-mentioned transistors and voltage terminals may also have different settings than the examples shown in FIGS. 2 to 5.

The following is an example of FIG. 2 to illustrate the working process of the leakage compensation circuit 100 according to the embodiment of the present disclosure.

When the output stage circuit 110 is in a high impedance state, both the first transistor M1 and the second transistor M2 are in the cut-off state. Assuming that the leakage current of the first transistor M1 is Ip and the leakage current of the second transistor M2 is In, there is a leakage current of (Ip−In) in a circuit without compensation. Firstly, the leakage current of the first transistor M1 and the second transistor M2 are sampled by the third transistor M3 and the fourth transistor M4, respectively. To save area, the width-length ratio of the third transistor M3 and the fourth transistor M4 may be reduced by n times with respect to the first transistor M1 and the second transistor M2. That is, the width-length ratio of the first transistor M1 is a fixed multiple n of the width-length ratio of the third transistor M3, and the width-length ratio of the second transistor M2 is a fixed multiple n of the width-length ratio of the fourth transistor M4. When clamping by a negative feedback amplifier with a unit gain, the drain voltages of the third transistor M3 and the fourth transistor M4 are equal to the drain voltages of the first transistor M1 and the second transistor M2. Therefore, the leakage currents of the third transistor M3 and the fourth transistor M4 are Ip/n and In/n, respectively. A difference between the leakage currents of the third transistor M3 and that of the fourth transistor M4, i.e. the first sampling current (Ip−In)/n, is supplied to the operational amplifier output stage circuit 132 via the first node N1. Then, the currents of the fifth transistor M5 and the sixth transistor M6 of the operational amplifier output stage circuit 132 are sampled by the seventh transistor M7 and the eighth transistor M8. The sizes of the seventh transistor M7 and the eighth transistor M8 are n times that of the fifth transistor M5 and the sixth transistor M6. That is, the width-length ratio of the seventh transistor M7 is a fixed multiple n of the width-length ratio of the fifth transistor M5, and the width-length ratio of the eighth transistor M8 is a fixed multiple n of the width-length ratio of the sixth transistor M6. Therefore, the difference between the currents of the seventh transistor M7 and the eighth transistor M8 is the second sampling current (Ip−In), which is supplied to the output stage circuit 110 via the second node N2. The drain electrodes of the seventh transistor M7 and the eighth transistor M8 are connected to the output terminal of the output stage circuit 110. The difference (Ip−In) between the leakage currents of the first transistor M1 and the second transistor M2 in the output stage circuit 110 flows entirely into the drain electrodes of the first transistor M1 and the second transistor M2, achieving no current flowing out of the output terminal Vout. Therefore, after compensation, the leakage current Leakage is 0.

Similarly, in conjunction with the example of FIG. 3, the working process of the leakage compensation circuit 100 according to an embodiment of the present disclosure is illustrated.

When the output stage circuit 110 is in a high impedance state, the first transistor M1 is in the cut-off state. Assuming that the leakage current of the first transistor M1 is Ip and the leakage current of the first resistor R1 is Ires, there is a leakage current of (Ip−Ires) in a circuit without compensation. Firstly, the leakage current of the first transistor M1 and the first resistor R1 are sampled by the third transistor M3 and the second resistor R2, respectively. To save area, the width-length ratio of the first transistor M1 is a fixed multiple n of the width-length ratio of the third transistor M3, and the resistance value of the second resistor R2 is a fixed multiple n of the resistance value of the first resistor R1. When clamping by the negative feedback amplifier with a unit gain, the drain voltage of the third transistor M3 and the voltage of the second resistor R2 are equal to the drain voltage of the first transistor M1 and the voltage of the first resistor R1 correspondingly. Therefore, the leakage currents of the third transistor M3 and the second resistor R2 are Ip/n and Ires/n. The difference between the leakage currents of the third transistor M3 and the second resistor R2, i.e. the first sampling current (Ip−Ires)/n, is supplied to the operational amplifier output stage circuit 132 via the first node N1. Then, the currents of the fifth transistor M5 and the sixth transistor M6 in the operational amplifier output stage circuit 132 are sampled by the seventh transistor M7 and the eighth transistor M8. The sizes of the seventh transistor M7 and the eighth transistor M8 are n times that of the fifth transistor M5 and the sixth transistor M6 respectively, that is, the width-length ratio of the seventh transistor M7 is a fixed multiple n of the width-length ratio of the fifth transistor M5, and the width-length ratio of the eighth transistor M8 is the fixed multiple n of the width-length ratio of the sixth transistor M6. Therefore, the difference between the currents of the seventh transistor M7 and the eighth transistor M8 is the second sampling current Ip-Ires, which is supplied to the output stage circuit 110 via the second node N2. That is, the drain electrodes of the seventh transistor M7 and the eighth transistor M8 are connected to the output terminal of the output stage circuit 110. The difference (Ip−Ires) between the leakage currents of the first transistor M1 and the first resistor R1 in the output stage circuit 110 flows entirely into the drain electrodes of the first transistor M1 and the first resistor R1, achieving no current flowing out of the output terminal Vout. Therefore, after compensation, the leakage current Leakage is 0.

Similarly, in conjunction with the example of FIG. 4, the working process of the leakage compensation circuit 100 according to an embodiment of the present disclosure is illustrated.

When the output stage circuit 110 is in a high impedance state, the second transistor M2 is in the cut-off state. Assuming that the leakage current of the second transistor M2 is In and the leakage current of the third resistor R3 is Ires, there is a leakage current of (Ires−In) in the circuit without compensation. Firstly, the leakage currents of the second transistor M2 and the third resistor R3 are sampled by the fourth transistor M4 and the fourth resistor R4, respectively. To save area, the width-length ratio of the second transistor M2 is a fixed multiple n of the width-length ratio of the fourth transistor M4, and the resistance value of the fourth resistor R4 is a fixed multiple n of the resistance value of the third resistor R3. When clamping by the negative feedback amplifier with a unit gain, the drain voltage of the fourth transistor M4 and the voltage of the fourth resistor R4 are equal to the drain voltage of the second transistor M2 and the voltage of the third resistor R3 correspondingly. Therefore, the leakage currents of the fourth transistor M4 and the fourth resistor R4 are In/n and Ires/n. The difference between the leakage currents of the third transistor M3 and the second resistor R2, i.e. the first sampling current (Ires In)/n, is supplied to the operational amplifier output stage circuit 132 via the first node N1. Then, the currents of the fifth transistor M5 and the sixth transistor M6 in the operational amplifier output stage circuit 132 are sampled by the seventh transistor M7 and the eighth transistor M8. The sizes of the seventh transistor M7 and the eighth transistor M8 is n times that of the fifth transistor M5 and the sixth transistor M6, that is, the width-length ratio of the seventh transistor M7 is a fixed multiple n of the width-length ratio of the fifth transistor M5, and the width-length ratio of the eighth transistor M8 is a fixed multiple n of the width-length ratio of the sixth transistor M6. Therefore, the difference between the currents of the seventh transistor M7 and the eighth transistor M8 is the second sampling current (Ires−In), which is supplied to the output stage circuit 110 via the second node N2. That is the drain electrodes of the seventh transistor M7 and the eighth transistor M8 are connected to the output terminal of the output stage circuit 110. The difference (Ires−In) between the leakage currents of the second transistor M2 and the third resistor R3 in the output stage circuit 110 flows entirely into the drain electrodes of the second transistor M2 and the third resistor R3, achieving no current flowing out of the output terminal Vout. Therefore, after compensation, the leakage current Leakage is 0.

In summary, the leakage compensation circuit according to the embodiments of the present disclosure compensates for the leakage current in the high-impedance-state output stage, and the high-impedance-state output stage no longer leaks current to the output terminal.

The embodiments of the present disclosures also provide a chip. The chip includes the leakage compensation circuit according to the embodiments of the present disclosure. This chip is, for example, a low dropout regulator chip and the like, which requires compensation for leakage current.

The embodiments of the present disclosures also provide an electronic device. The electronic device includes the chip according to the embodiments of the present disclosure. The electronic device is, for example, any electronic device that needs to compensate for leakage current.

The flowchart and block diagrams in the figures illustrate the architecture, functionality, and operation of possible implementations of apparatuses and methods according to various embodiments of the present invention. In this regard, each block in the flowchart or block diagrams may represent a module, segment, or portion of instructions, which includes one or more executable instructions for implementing the specified logical function(s). In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

As used herein and in the appended claims, the singular form of a word includes the plural, and vice versa, unless the context clearly dictates otherwise. Thus, singular words are generally inclusive of the plurals of the respective terms. Similarly, the words "include" and "comprise" are to be interpreted as inclusively rather than exclusively. Likewise, the terms "include" and "or" should be construed to be inclusive, unless such an interpretation is clearly prohibited from the context. Where used herein the term "examples," particularly when followed by a listing of terms is merely exemplary and illustrative, and should not be deemed to be exclusive or comprehensive.

Further adaptive aspects and scopes become apparent from the description provided herein. It should be understood that various aspects of the present disclosure may be implemented separately or in combination with one or more other aspects. It should also be understood that the description and specific embodiments in the present disclosure are intended to describe rather than limit the scope of the present disclosure.

A plurality of embodiments of the present disclosure has been described in detail above. However, apparently those skilled in the art may make various modifications and variations on the embodiments of the present disclosure without departing from the spirit and scope of the present disclosure. The scope of protecting of the present disclosure is limited by the appended claims.

What is claimed is:

1. A leakage compensation circuit, comprising: an output stage circuit, a first sampling circuit, an operational amplifier circuit, and a second sampling circuit, wherein the operational amplifier circuit comprises an operational amplifier output stage circuit and an operational amplifier first stage circuit, wherein the operational amplifier output stage circuit and the operational amplifier first stage circuit are coupled together, wherein the first sampling circuit is configured to sample a leakage current of the output stage circuit to obtain a first sampling current, and provide the first sampling current to the operational amplifier output stage circuit via a first node;

wherein the second sampling circuit is configured to sample a current of the operational amplifier output stage circuit to obtain a second sampling current, and provide the second sampling current to the output stage circuit via a second node to compensate for the leakage current of the output stage circuit; and wherein the operational amplifier first stage circuit is configured to clamp voltages at the first node and the second node.

2. The leakage compensation circuit according to claim 1, wherein a non-inverting input terminal of the operational amplifier first stage circuit is coupled to the second node, and an inverting input terminal of the operational amplifier first stage circuit is coupled to the first node.

3. The leakage compensation circuit according to claim 2, wherein the operational amplifier output stage circuit comprises a fifth transistor and a sixth transistor, wherein a control electrode of the fifth transistor is coupled to a first output terminal of the operational amplifier first stage circuit, a first electrode of the fifth transistor is coupled to a fifth voltage terminal, and a second electrode of the fifth transistor is coupled to the first node; and wherein a control electrode of the sixth transistor is coupled to a second output terminal of the operational amplifier first stage circuit, a first electrode of the sixth transistor is coupled to a second voltage terminal, and a second electrode of the sixth transistor is coupled to the first node.

4. The leakage compensation circuit according to claim 3, wherein the second sampling circuit comprises a seventh transistor and an eighth transistor, wherein a control electrode of the seventh transistor is coupled to the first output terminal of the operational amplifier first stage circuit, a first electrode of the seventh transistor is coupled to the fifth voltage terminal, a second electrode of the seventh transistor is coupled to the second node, and a width-length ratio of the seventh transistor is a fixed multiple of a width-length ratio of the fifth transistor; and wherein a control electrode of the eighth transistor is coupled to the second output terminal of the operational amplifier first stage circuit, a first electrode of the eighth transistor is coupled to the second voltage terminal, a second electrode of the eighth transistor is coupled to the second node, and a width-length ratio of the eighth transistor is a fixed multiple of a width-length ratio of the sixth transistor.

5. The leakage compensation circuit according to claim 4, wherein the operational amplifier output stage circuit further comprises: a ninth transistor, a tenth transistor, an eleventh transistor, and a twelfth transistor, wherein a control electrode of the ninth transistor is coupled to a sixth voltage terminal, a first electrode of the ninth transistor is coupled to the second electrode of the seventh transistor, and a second electrode of the ninth transistor is coupled to the second node;

wherein a control electrode of the tenth transistor is coupled to the sixth voltage terminal, a first electrode of the tenth transistor is coupled to the second electrode of the fifth transistor, and a second electrode of the tenth transistor is coupled to the first node;

wherein a control electrode of the eleventh transistor is coupled to a seventh voltage terminal, a first electrode of the eleventh transistor is coupled to the second electrode of the eighth transistor, and a second electrode of the eleventh transistor is coupled to the second node; and wherein a control electrode of the twelfth transistor is coupled to the seventh voltage terminal, a first electrode of the twelfth transistor is coupled to the second electrode of the sixth transistor, and a second electrode of the twelfth transistor is coupled to the first node.

6. The leakage compensation circuit according to claim 1, wherein the output stage circuit comprises: a first transistor and a second transistor, wherein a control electrode of the first transistor is coupled to a third voltage terminal, a first electrode of the first transistor is coupled to a first voltage terminal, and a second electrode of the first transistor is coupled to the second node;

wherein a control electrode of the second transistor is coupled to a fourth voltage terminal, a first electrode of the second transistor is coupled to a second voltage terminal, and a second electrode of the second transistor is coupled to the second node;

wherein the first sampling circuit comprises a third transistor and a fourth transistor, wherein a control electrode of the third transistor is coupled to the third voltage terminal, a first electrode of the third transistor is coupled to the first voltage terminal, and a second electrode of the third transistor is coupled to the first node;

wherein a control electrode of the fourth transistor is coupled to the fourth voltage terminal, a first electrode of the fourth transistor is coupled to the second voltage terminal, and a second electrode of the fourth transistor is coupled to the first node; and wherein a width-length ratio of the first transistor is a fixed multiple of a width-length ratio of the third transistor, and a width-length ratio of the second transistor is a fixed multiple of a width-length ratio of the fourth transistor.

7. The leakage compensation circuit according to claim 1, wherein the output stage circuit comprises a first transistor and a first resistor, wherein a control electrode of the first transistor is coupled to a third voltage terminal, a first electrode of the first transistor is coupled to a first voltage terminal, and a second electrode of the first transistor is coupled to the second node;

wherein a first end of the first resistor is coupled to the second node, and a second end of the first resistor is coupled to a second voltage terminal;

wherein the first sampling circuit comprises a third transistor and a second resistor, wherein a control electrode of the third transistor is coupled to the third voltage terminal, a first electrode of the third transistor is coupled to the first voltage terminal, and a second electrode of the third transistor is coupled to the first node;

wherein a first end of the second resistor is coupled to the first node, and a second end of the second resistor is coupled to the second voltage terminal; and wherein a width-length ratio of the first transistor is a fixed multiple of a width-length ratio of the third transistor, and a resistance value of the second resistor is a fixed multiple of a resistance value of the first resistor.

8. The leakage compensation circuit according to claim 1, wherein the output stage circuit comprises a second transistor and a third resistor, wherein a control electrode of the second transistor is coupled to a fourth voltage terminal, a first electrode of the second transistor is coupled to a second voltage terminal, and a second electrode of the second transistor is coupled to the second node;

wherein a first end of the third resistor is coupled to the second node, and a second end of the third resistor is coupled to a first voltage terminal;

wherein the first sampling circuit comprises a fourth transistor and a fourth resistor, wherein a control electrode of the fourth transistor is coupled to the fourth voltage terminal, a first electrode of the fourth transistor is coupled to the second voltage terminal, and a second electrode of the fourth transistor is coupled to the first node;

wherein a first end of the fourth resistor is coupled to the first node, and a second end of the fourth resistor is coupled to the first voltage terminal; and wherein a width-length ratio of the second transistor is a fixed multiple of a width-length ratio of the fourth transistor, and a resistance value of the fourth resistor is a fixed multiple of a resistance value of the third resistor.

9. A chip comprising the leakage compensation circuit according to claim 1.

10. An electronic device comprising the chip according to claim 6.

11. The leakage compensation circuit according to claim 2, wherein the output stage circuit comprises: a first transistor and a second transistor, wherein a control electrode of the first transistor is coupled to a third voltage terminal, a first electrode of the first transistor is coupled to a first voltage terminal, and a second electrode of the first transistor is coupled to the second node;

wherein a control electrode of the second transistor is coupled to a fourth voltage terminal, a first electrode of the second transistor is coupled to a second voltage terminal, and a second electrode of the second transistor is coupled to the second node;

wherein the first sampling circuit comprises a third transistor and a fourth transistor, wherein a control electrode of the third transistor is coupled to the third voltage terminal, a first electrode of the third transistor is coupled to the first voltage terminal, and a second electrode of the third transistor is coupled to the first node;

wherein a control electrode of the fourth transistor is coupled to the fourth voltage terminal, a first electrode of the fourth transistor is coupled to the second voltage terminal, and a second electrode of the fourth transistor is coupled to the first node; and wherein a width-length ratio of the first transistor is a fixed multiple of a width-length ratio of the third transistor, and a width-length ratio of the second transistor is a fixed multiple of a width-length ratio of the fourth transistor.

12. The leakage compensation circuit according to claim 3, wherein the output stage circuit comprises: a first transistor and a second transistor, wherein a control electrode of the first transistor is coupled to a third voltage terminal, a first electrode of the first transistor is coupled to a first voltage terminal, and a second electrode of the first transistor is coupled to the second node;

wherein a control electrode of the second transistor is coupled to a fourth voltage terminal, a first electrode of the second transistor is coupled to the second voltage terminal, and a second electrode of the second transistor is coupled to the second node;

wherein the first sampling circuit comprises a third transistor and a fourth transistor, wherein a control electrode of the third transistor is coupled to the third voltage terminal, a first electrode of the third transistor is coupled to the first voltage terminal, and a second electrode of the third transistor is coupled to the first node;

wherein a control electrode of the fourth transistor is coupled to the fourth voltage terminal, a first electrode of the fourth transistor is coupled to the second voltage terminal, and a second electrode of the fourth transistor is coupled to the first node; and wherein a width-length ratio of the first transistor is a fixed multiple of a width-length ratio of the third transistor, and a width-length ratio of the second transistor is a fixed multiple of a width-length ratio of the fourth transistor.

13. The leakage compensation circuit according to claim 4, wherein the output stage circuit comprises: a first transistor and a second transistor, wherein a control electrode of the first transistor is coupled to a third voltage terminal, a first electrode of the first transistor is coupled to a first voltage terminal, and a second electrode of the first transistor is coupled to the second node;

wherein a control electrode of the second transistor is coupled to a fourth voltage terminal, a first electrode of the second transistor is coupled to the second voltage terminal, and a second electrode of the second transistor is coupled to the second node;

wherein the first sampling circuit comprises a third transistor and a fourth transistor, wherein a control electrode of the third transistor is coupled to the third voltage terminal, a first electrode of the third transistor is coupled to the first voltage terminal, and a second electrode of the third transistor is coupled to the first node;

wherein a control electrode of the fourth transistor is coupled to the fourth voltage terminal, a first electrode of the fourth transistor is coupled to the second voltage terminal, and a second electrode of the fourth transistor is coupled to the first node; and wherein a width-length ratio of the first transistor is a fixed multiple of a width-length ratio of the third transistor, and a width-length ratio of the second transistor is a fixed multiple of a width-length ratio of the fourth transistor.

14. The leakage compensation circuit according to claim 5, wherein the output stage circuit comprises: a first transistor and a second transistor, wherein a control electrode of the first transistor is coupled to a third voltage terminal, a first electrode of the first transistor is coupled to a first voltage terminal, and a second electrode of the first transistor is coupled to the second node;

wherein a control electrode of the second transistor is coupled to a fourth voltage terminal, a first electrode of the second transistor is coupled to the second voltage terminal, and a second electrode of the second transistor is coupled to the second node;

wherein the first sampling circuit comprises a third transistor and a fourth transistor, wherein a control electrode of the third transistor is coupled to the third voltage terminal, a first electrode of the third transistor is coupled to the first voltage terminal, and a second electrode of the third transistor is coupled to the first node;

wherein a control electrode of the fourth transistor is coupled to the fourth voltage terminal, a first electrode of the fourth transistor is coupled to the second voltage terminal, and a second electrode of the fourth transistor is coupled to the first node; and wherein a width-length ratio of the first transistor is a fixed multiple of a width-length ratio of the third transistor, and a width-length ratio of the second transistor is a fixed multiple of a width-length ratio of the fourth transistor.

15. The leakage compensation circuit according to claim 2, wherein the output stage circuit comprises a first transistor and a first resistor, wherein a control electrode of the first transistor is coupled to a third voltage terminal, a first electrode of the first transistor is coupled to a first voltage terminal, and a second electrode of the first transistor is coupled to the second node;

wherein a first end of the first resistor is coupled to the second node, and a second end of the first resistor is coupled to a second voltage terminal;

wherein the first sampling circuit comprises a third transistor and a second resistor, wherein a control electrode of the third transistor is coupled to the third voltage terminal, a first electrode of the third transistor is coupled to the first voltage terminal, and a second electrode of the third transistor is coupled to the first node;

wherein a first end of the second resistor is coupled to the first node, and a second end of the second resistor is coupled to the second voltage terminal; and wherein a width-length ratio of the first transistor is a fixed multiple of a width-length ratio of the third transistor, and a resistance value of the second resistor is a fixed multiple of a resistance value of the first resistor.

16. The leakage compensation circuit according to claim 3, wherein the output stage circuit comprises a first transistor and a first resistor, wherein a control electrode of the first transistor is coupled to a third voltage terminal, a first electrode of the first transistor is coupled to a first voltage terminal, and a second electrode of the first transistor is coupled to the second node;

wherein a first end of the first resistor is coupled to the second node, and a second end of the first resistor is coupled to the second voltage terminal;

wherein the first sampling circuit comprises a third transistor and a second resistor, wherein a control electrode of the third transistor is coupled to the third voltage terminal, a first electrode of the third transistor is coupled to the first voltage terminal, and a second electrode of the third transistor is coupled to the first node;

wherein a first end of the second resistor is coupled to the first node, and a second end of the second resistor is coupled to the second voltage terminal; and wherein a width-length ratio of the first transistor is a fixed multiple of a width-length ratio of the third transistor, and a resistance value of the second resistor is a fixed multiple of a resistance value of the first resistor.

17. The leakage compensation circuit according to claim 4, wherein the output stage circuit comprises a first transistor and a first resistor, wherein a control electrode of the first transistor is coupled to a third voltage terminal, a first electrode of the first transistor is coupled to a first voltage terminal, and a second electrode of the first transistor is coupled to the second node;

wherein a first end of the first resistor is coupled to the second node, and a second end of the first resistor is coupled to the second voltage terminal;

wherein the first sampling circuit comprises a third transistor and a second resistor, wherein a control electrode of the third transistor is coupled to the third voltage terminal, a first electrode of the third transistor is coupled to the first voltage terminal, and a second electrode of the third transistor is coupled to the first node;

wherein a first end of the second resistor is coupled to the first node, and a second end of the second resistor is coupled to the second voltage terminal; and wherein a width-length ratio of the first transistor is a fixed multiple of a width-length ratio of the third transistor, and a resistance value of the second resistor is a fixed multiple of a resistance value of the first resistor.

18. The leakage compensation circuit according to claim 5, wherein the output stage circuit comprises a first transistor and a first resistor, wherein a control electrode of the first transistor is coupled to a third voltage terminal, a first electrode of the first transistor is coupled to a first voltage terminal, and a second electrode of the first transistor is coupled to the second node;

wherein a first end of the first resistor is coupled to the second node, and a second end of the first resistor is coupled to the second voltage terminal;

wherein the first sampling circuit comprises a third transistor and a second resistor, wherein a control electrode of the third transistor is coupled to the third voltage terminal, a first electrode of the third transistor is coupled to the first voltage terminal, and a second electrode of the third transistor is coupled to the first node;

wherein a first end of the second resistor is coupled to the first node, and a second end of the second resistor is coupled to the second voltage terminal; and wherein a width-length ratio of the first transistor is a fixed multiple of a width-length ratio of the third transistor, and a resistance value of the second resistor is a fixed multiple of a resistance value of the first resistor.

19. The leakage compensation circuit according to claim 2, wherein the output stage circuit comprises a second transistor and a third resistor, wherein a control electrode of the second transistor is coupled to a fourth voltage terminal, a first electrode of the second transistor is coupled to a second voltage terminal, and a second electrode of the second transistor is coupled to the second node;

wherein a first end of the third resistor is coupled to the second node, and a second end of the third resistor is coupled to a first voltage terminal;

wherein the first sampling circuit comprises a fourth transistor and a fourth resistor, wherein a control electrode of the fourth transistor is coupled to the fourth voltage terminal, a first electrode of the fourth transistor is coupled to the second voltage terminal, and a second electrode of the fourth transistor is coupled to the first node;

wherein a first end of the fourth resistor is coupled to the first node, and a second end of the fourth resistor is coupled to the first voltage terminal; and wherein a width-length ratio of the second transistor is a fixed multiple of a width-length ratio of the fourth transistor, and a resistance value of the fourth resistor is a fixed multiple of a resistance value of the third resistor.

20. The leakage compensation circuit according to claim 3, wherein the output stage circuit comprises a second transistor and a third resistor, wherein a control electrode of the second transistor is coupled to a fourth voltage terminal, a first electrode of the second transistor is coupled to the second voltage terminal, and a second electrode of the second transistor is coupled to the second node;

wherein a first end of the third resistor is coupled to the second node, and a second end of the third resistor is coupled to a first voltage terminal;

wherein the first sampling circuit comprises a fourth transistor and a fourth resistor, wherein a control electrode of the fourth transistor is coupled to the fourth voltage terminal, a first electrode of the fourth transistor is coupled to the second voltage terminal, and a second electrode of the fourth transistor is coupled to the first node;

wherein a first end of the fourth resistor is coupled to the first node, and a second end of the fourth resistor is coupled to the first voltage terminal; and wherein a width-length ratio of the second transistor is a fixed multiple of a width-length ratio of the fourth transistor, and a resistance value of the fourth resistor is a fixed multiple of a resistance value of the third resistor.

* * * * *